(12) United States Patent
Nomasaki et al.

(10) Patent No.: US 7,940,121 B2
(45) Date of Patent: May 10, 2011

(54) OPERATIONAL AMPLIFIER AND PIPELINE AD CONVERTER

(75) Inventors: Daisuke Nomasaki, Osaka (JP); Koji Oka, Osaka (JP)

(73) Assignee: Panasonic Corporation, Osaka (JP)

( * ) Notice: Subject to any disclaimer, the term of this patent is extended or adjusted under 35 U.S.C. 154(b) by 147 days.

(21) Appl. No.: 12/445,003

(22) PCT Filed: Jul. 30, 2008

(86) PCT No.: PCT/JP2008/002041
§ 371 (c)(1),
(2), (4) Date: Apr. 9, 2009

(87) PCT Pub. No.: WO2009/078112
PCT Pub. Date: Jun. 25, 2009

(65) Prior Publication Data
US 2010/0188151 A1 Jul. 29, 2010

(30) Foreign Application Priority Data
Dec. 19, 2007 (JP) .................................. 2007-327943

(51) Int. Cl.
*H03F 3/45* (2006.01)
(52) U.S. Cl. ....................................................... 330/253
(58) Field of Classification Search ........... 330/252–261
See application file for complete search history.

(56) References Cited

U.S. PATENT DOCUMENTS

| | | | |
|---|---|---|---|
| 6,069,866 A * | 5/2000 | Pietruszynski et al. | 369/124.11 |
| 6,157,259 A | 12/2000 | Dasgupta | |
| 7,078,968 B2 | 7/2006 | Gaeta et al. | |

FOREIGN PATENT DOCUMENTS

| | | |
|---|---|---|
| JP | 59-067704 | 4/1984 |
| JP | 60-037820 | 2/1985 |
| JP | 02-060311 | 2/1990 |
| JP | 03-121516 | 5/1991 |
| JP | 04-105121 | 4/1992 |
| JP | 05-048052 | 2/1993 |
| JP | 07-202700 | 8/1995 |
| JP | 2542928 | 7/1997 |
| JP | 09-331217 | 12/1997 |
| JP | 2000-040368 | 2/2000 |
| JP | 2002-223165 | 8/2002 |
| JP | 2005-032768 | 2/2005 |
| JP | 2006-129197 | 5/2006 |

* cited by examiner

*Primary Examiner* — Robert Pascal
*Assistant Examiner* — Hieu P Nguyen
(74) *Attorney, Agent, or Firm* — McDermott Will & Emery LLP

(57) ABSTRACT

A differential voltage interconnect (W101a) electrically connects the gate electrode of a transistor to be used among differential transistors (T101a, T101a, . . . ) to an input node receiving an input voltage (Vinn), and a differential voltage interconnect (W101b) electrically connects the gate electrode of a transistor to be used among differential transistors (T101b, T101b, . . . ) to an input node receiving an input voltage (Vinp). A bias voltage interconnect (W102) electrically connects the gate electrode of a transistor to be used among current source transistors (T102, T102, . . . ) to a bias node receiving a bias voltage (VBN), and a bias voltage interconnect (W103) electrically connects the gate electrodes of transistors to be used among load transistors (T103a, T103a, . . . , T103b, T103b, . . . ) to a bias node receiving a bias voltage (VBP).

11 Claims, 15 Drawing Sheets

US 7,940,121 B2

OPERATIONAL AMPLIFIER AND PIPELINE AD CONVERTER

RELATED APPLICATIONS

This application is the U.S. National Phase under 35 U.S.C. §371 of International Application No. PCT/JP2008/002041, filed on Jul. 30, 2008, which in turn claims the benefit of Japanese Application No. 2007-327943, filed on Dec. 19, 2007, the disclosures of which Applications are incorporated by reference herein.

TECHNICAL FIELD

The present invention relates to an operational amplifier and a pipeline AD converter including the same, and more particularly to a technique of changing the circuit performance of an operational amplifier arbitrarily.

BACKGROUND ART

Conventionally, for amplification of an input voltage, operational amplifiers have been used in a variety of technical fields. For example, operational amplifiers have been used for a pipeline AD converter. The pipeline AD converter has a plurality of conversion stages each including an analog-digital conversion circuit, a digital-analog conversion circuit, a capacitor, an operational amplifier and the like. In the conversion stages, analog-digital conversion and amplification/output of the residual voltage are performed sequentially, whereby an analog signal is converted to a digital signal bit by bit. Such a pipeline AD converter is often used for video and communication purposes.

FIG. 14 is a circuit diagram of a general operational amplifier. The operational amplifier of FIG. 14 amplifies an input differential voltage composed of input voltages Vinp and Vinn and outputs the amplified voltage as an output differential voltage composed of output voltages Voutp and Voutn. The input voltages Vinp and Vinn are respectively supplied to the gates of differential transistors T901a and T901b. A bias voltage VBN is supplied to the gate of a current source transistor T902, and a bias voltage VBP is supplied to the gate electrodes of load transistors T903a and T903b.

FIG. 15 shows a layout pattern of the operational amplifier of FIG. 14. The gate electrodes of the differential transistors T901a and T901b are electrically connected to an input node receiving the input voltage Vinp and an input node receiving the input voltage Vinn via interconnects W901a and W901b, respectively. The gate electrode of the current source transistor T902 is connected to a bias node receiving the bias voltage VBN via an interconnect W902. The gate electrodes of the load transistors T903a and T903b are connected to a bias node receiving the bias voltage VBP via an interconnect W903.

An operational amplifier is designed through various design steps (a device placement step, a wiring step, a rule verification step, etc.) so that the circuit performance (e.g., current drive capability) of the operational amplifier is in a desired level of performance. In the device placement step, placement of elements (transistors, etc.) constituting the operational amplifier is determined, and the resultant placement of elements is described in a layout pattern. In the wiring step, interconnects for connecting the elements is described in the layout pattern. In the rule verification step, whether or not an operational amplifier circuit can be fabricated normally according to the layout pattern (whether or not the layout pattern does not violate various design rules is verified).

Layout preparation methods for a pipeline AD converter are disclosed in Japanese Laid-Open Patent Publication No. 2002-223165 (Patent Document 1) and the like.

Patent Document 1: Japanese Laid-Open Patent Publication No. 2002-223165 (p. 11, FIGS. 7 and 8)

DISCLOSURE OF THE INVENTION

Problems to be Solved by the Invention

Conventionally, for change of the circuit performance of an operational amplifier, the operational amplifier must be redesigned from the stage of placement of elements. This increases the number of design steps required for design change of the operational amplifier, and hence increases the time required until the operational amplifier is provided (turn-around time (TAT)).

In particular, in recent years, there have been demands for finer resolution (specifically, 8-bit or higher resolution) in the video field and the communication field. To achieve finer resolution, a pipeline AD converter has a number of conversion stages. In such a pipeline AD converter, the circuit performance required is different among the conversion stages. Hence, operational amplifiers included in the different conversion stages must be designed individually. This greatly increases the number of design steps for the pipeline AD converter, and hence much time has been spent in designing the pipeline AD converter.

An object of the present invention is providing an operational amplifier and a pipeline AD converter involving a smaller number of design steps for changing the circuit performance than in the conventional case.

Means for Solving the Problems

According to one aspect of the present invention, the operational amplifier includes: an element formation layer including a differential section for converting a differential voltage composed of first and second input voltages to a current pair, a current adjustment section for adjusting the current amount supplied to the differential section, and an active load section for receiving the current pair from the differential section; and an interconnect layer formed on the element formation layer, the interconnect layer including first and second differential voltage interconnects and first and second bias voltage interconnects, wherein the differential section includes a plurality of first and second differential transistors having a first polarity, the current adjustment section includes a plurality of current source transistors having the first polarity, the active load section includes a plurality of first and second load transistors having a second polarity reverse to the first polarity, the first differential voltage interconnect electrically connects a gate electrode of a transistor to be used among the plurality of first differential transistors to a first input node receiving the first input voltage, the second differential voltage interconnect electrically connects a gate electrode of a transistor to be used among the plurality of second differential transistors to a second input node receiving the second input voltage, the first bias voltage interconnect electrically connects a gate electrode of a transistor to be used among the plurality of current source transistors to a first bias node receiving a first bias voltage for turning ON a transistor having the first polarity, and the second bias voltage interconnect electrically connects gate electrodes of transistors to be used among the plurality of first and second load transistors to a second bias node receiving a second bias voltage for turning ON a transistor having the second polarity.

In the operational amplifier described above, the circuit performance (e.g., the current drive capability, etc.) of the operational amplifier can be arbitrarily changed only by changing the interconnect pattern in the interconnect layer without the necessity of changing the configuration of the element formation layer. Hence, the number of design steps for the operational amplifier can be made smaller than in the case of redesigning the operational amplifier from the placement of elements as conventionally done, and thus the operational amplifier can be provided with a small turnaround time (TAT).

The pipeline AD converter of the present invention has a plurality of conversion stages each including the operational amplifier described above, wherein each of the plurality of conversion stages includes: an analog-digital conversion circuit for converting an input differential voltage from the preceding stage to a digital value; a digital-analog conversion circuit for converting the digital value obtained by the analog-digital conversion circuit to an intermediate differential voltage; and a charge operation circuit having a capacitance section for sampling the input differential voltage and the operational amplifier for amplifying a mixed differential voltage of the input differential voltage sampled by the capacitance section and the intermediate differential voltage obtained by the digital-analog conversion circuit, and the operational amplifier included in each of the plurality of conversion stages is the same in the configuration of the element formation layer as the other operational amplifiers, and is different in the configuration of the interconnect layer from the other operational amplifiers.

In the pipeline AD converter described above, the circuit performance of the operational amplifier included in each of the conversion stages can be arbitrarily set only by changing the interconnect pattern in the interconnect layer. Hence, the number of design steps for the pipeline AD converter can be made smaller than in the conventional case.

According to another aspect of the invention, the operational amplifier includes: a differential section for converting a differential voltage composed of first and second input voltages to a current pair; a current adjustment section for adjusting the current amount supplied to the differential section; and an active load section for receiving the current pair from the differential section, wherein the differential section includes: a plurality of first and second differential transistors having a first polarity; a first switch portion for connecting gate electrodes of the plurality of first differential transistors to either one of a first input node for receiving the first input voltage and a first OFF voltage node for receiving a first OFF voltage for turning OFF a transistor having the first polarity; and a second switch portion for connecting gate electrodes of the plurality of second differential transistors to either one of a second input node for receiving the second input voltage and the first OFF voltage node, the current adjustment section includes: a plurality of current source transistors having the first polarity; and a third switch portion for connecting gate electrodes of the plurality of current source transistors to either one of a first bias node for receiving a first bias voltage for turning ON a transistor having the first polarity and the first OFF voltage node, and the active load section includes: a plurality of first and second load transistors having a second polarity reverse to the first polarity; and a fourth switch portion for connecting gate electrodes of the plurality of first and second load transistors to either one of a second bias node for receiving a second bias voltage for taming ON a transistor having the second polarity and a second OFF voltage node for receiving a second OFF voltage for turning OFF a transistor having the second polarity.

In the operational amplifier described above, the circuit performance of the operational amplifier can be arbitrarily set only by switching the connection destination of the gate electrode by means of each switch portion. Hence, the number of design steps for the operational amplifier can be made smaller than in the conventional case (redesigning the operational amplifier from the placement of elements), and thus the operational amplifier can be provided with a small TAT.

The pipeline AD converter of the present invention has a plurality of conversion stages each including the operational amplifier described above, wherein each of the plurality of conversion stages includes: an analog-digital conversion circuit for converting an input differential voltage from the preceding stage to a digital value; a digital-analog conversion circuit for converting the digital value obtained by the analog-digital conversion circuit to an intermediate differential voltage; and a charge operation circuit having a capacitance section for sampling the input differential voltage and the operational amplifier for amplifying a mixed differential voltage of the input differential voltage sampled by the capacitance section and the intermediate differential voltage obtained by the digital-analog conversion circuit, and the operational amplifier included in each of the plurality of conversion stages is the same in configuration as the other operational amplifiers.

In the pipeline AD converter described above, it is unnecessary to design the operational amplifier individually for each conversion stage. Hence, the number of design steps for the pipeline AD converter can be made smaller than in the conventional case.

According to yet another aspect of the present invention, the pipeline AD converter has a plurality of conversion stages, wherein each of the plurality of conversion stages includes: an analog-digital conversion circuit for converting an input differential voltage from the preceding stage to a digital value; a digital-analog conversion circuit for converting the digital value obtained by the analog-digital conversion circuit to an intermediate differential voltage; and a charge operation circuit having a capacitance section for sampling the input differential voltage and a differential amplification section for amplifying a mixed differential voltage of the input differential voltage sampled by the capacitance section and the intermediate differential voltage obtained by the digital-analog conversion circuit, and the differential amplification section includes a plurality of operational amplifiers having the same configuration.

In the pipeline AD converter described above, the circuit performance of the conversion stage can be arbitrarily set only by changing the interconnect pattern without the necessity of changing the placement of elements. Hence, the number of design steps is for the pipeline AD converter can be made smaller than in the conventional case, and thus the pipeline AD converter can be provided with a short TAT.

Preferably, each of the plurality of conversion stages further includes: an input switch circuit for connecting an input terminal pair of each of the plurality of operational amplifiers to either one of an OFF voltage node for receiving an OFF voltage for turning OFF the operational amplifier and the capacitance section; and an output switch circuit for switching the connection between an output terminal pair of each of the plurality of operational amplifiers and an output node for outputting an output voltage of the conversion stage.

In the pipeline AD converter described above, the circuit performance of the conversion stage can be arbitrarily set by switching the connection state of each of the operational amplifiers by means of the input switch circuit and the output switch circuit without the necessity of changing the configuration of the conversion stage. Hence, the number of design steps for the pipeline AD converter can be made smaller than in the conventional case, and thus the pipeline AD converter can be provided with a short TAT.

Effect of the Invention

As described above, an operational amplifier and a pipeline AD converter involving a smaller number of design steps for changing the circuit performance than in the conventional case can be provided.

Figure 1:
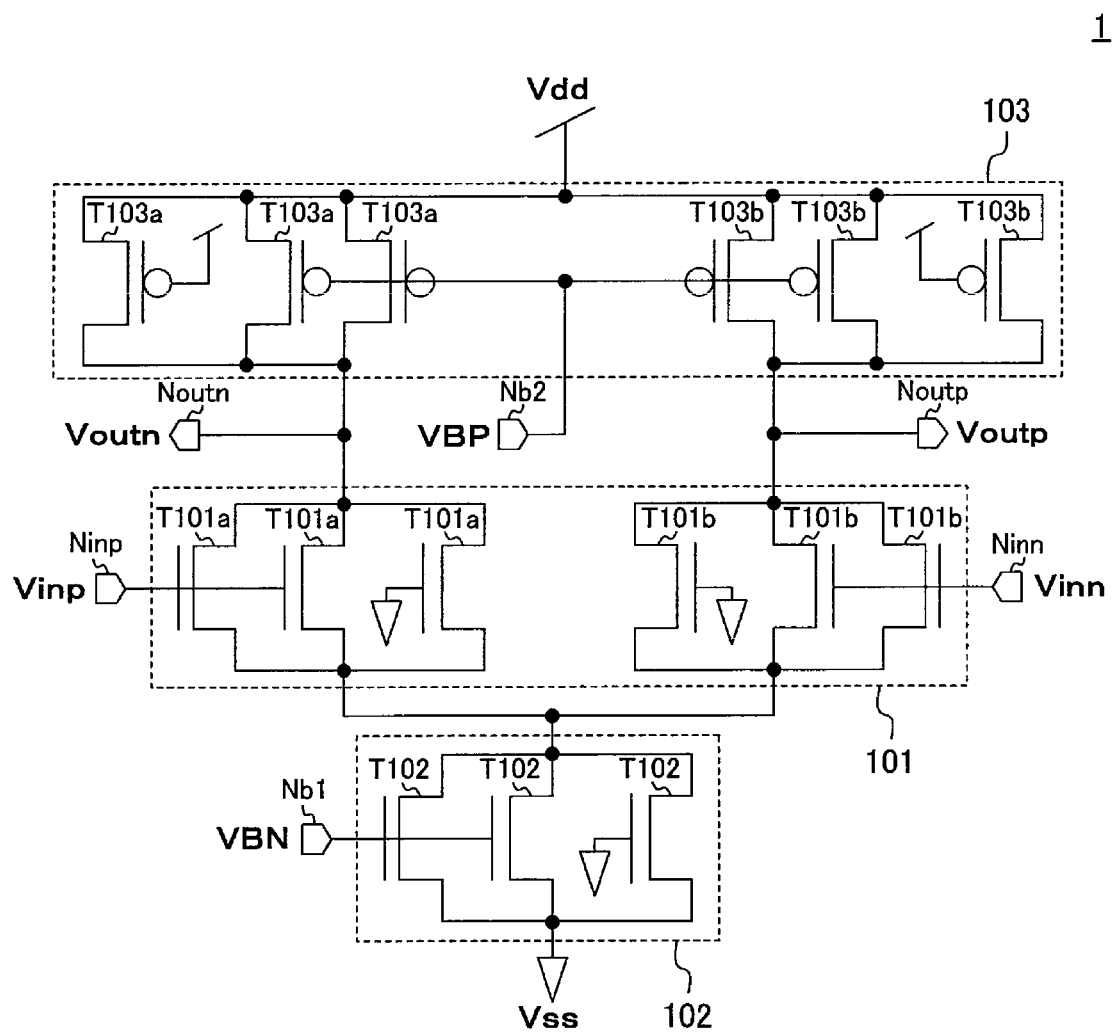
FIG. 1 is a circuit diagram of an operational amplifier of Embodiment 1 of the present invention.

DESCRIPTION OF REFERENCE NUMERALS 1, 1a, 3, 402 Operational amplifier
101, 31 Differential section
102, 32 Current adjustment section
103, 33 Active load section
T101a, T101b Differential transistor
T102 Current source transistor
T103a, T103b Load transistor
W101a, W101b Differential voltage interconnect
W102, W103 Bias voltage interconnect
W111a, W111b Output interconnect
W112a, W112b, W112c, W112d Intermediate interconnect
W113, W114a, W114b Power supply interconnect
W201a, W201b, W202, W203a, W203b OFF voltage interconnect
W301 Auxiliary interconnect
2 Pipeline AD converter
21, 41, 51 Conversion stage
22 Sub-AD conversion circuit
23 Decode logic circuit
201 Analog-digital conversion circuit
202 Digital-analog conversion circuit
203 Operation circuit
204 Capacitance section
301a, 301b, 302a, 302b, 303 to 306 Connection switch portion
401 Differential amplification section
501 Input connection switch section
502 Output connection switch section

BEST MODE FOR CARRYING OUT THE INVENTION

Hereinafter, embodiments of the present invention will be described in detail with reference to the relevant drawings. Note that throughout the drawings, identical or corresponding components are denoted by the same reference numerals and description thereof is not repeated.

Embodiment 1

FIG. 1 is a circuit diagram of an operational amplifier of Embodiment 1 of the present invention. The operational amplifier 1 of this embodiment amplifies a differential voltage composed of input voltages Vinn and Vinp and outputs output voltages Voutn and Voutp. The operational amplifier 1 is formed of an element formation layer including a differential section 101, a current adjustment section 102 and an active load section 103 and an interconnect layer including a plurality of interconnects for electrically connecting these sections with one another.

The differential section 101, which converts the input voltages Vinn and Vinp to a current pair, includes a plurality of differential transistors T101a, T101a, . . . and a plurality of differential transistors T101b, T101b, . . . . The gate electrode of a differential transistor to be used, among the differential transistors T101a, T101a, . . . , is connected to an input node Ninp receiving the input voltage Vinp. Likewise, the gate electrode of a differential transistor to be used, among the differential transistors T101b, T101b, . . . , is connected to an input node Ninn receiving the input voltage Vinn.

The current adjustment section 102, which adjusts the current amount supplied to the differential section 101, includes a plurality of current source transistors T102, T102, . . . . The current source transistors T102 have the same polarity as the differential transistors T101a and T101b. In the illustrated example, the differential transistors T101a and T101b and the current source transistors T102 are N-channel transistors. The gate electrode of a current source transistor to be used, among the current source transistors T102, T102, . . . , is connected to a bias node Nb1 receiving the bias voltage VBN.

The active load section 103, which receives the current pair from the differential section 101 and generates the output voltages Voutn and Voutp, includes a plurality of load transistors T103a, T103a, . . . and a plurality of load transistors T103b, T103b, . . . . The load transistors T103a and T103b have the polarity reverse to that of the differential transistors T101a. In the illustrated example, the load transistors T103a and T103b are P-channel transistors. The gate electrodes of load transistors to be used, among the load transistors T103a, T103a, . . . and the load transistors T103b, T103b . . . , are connected to a bias node Nb2 receiving the bias voltage VBP.

The gate electrode of a transistor that is not used, among the differential transistors T101a, T101a, . . . , the differential transistors T101b, T101b, . . . and the current source transistors T102, T102, . . . , is connected to an OFF voltage node (ground node in the illustrated example) receiving an OFF voltage (ground voltage Vss in the illustrated example) for turning OFF an N-channel transistor. Likewise, the gate electrode of a transistor that is not used, among the load transistors T103a, T103a, . . . and the load transistors T103b, T103b, . . . , is connected to a power supply node receiving the power supply voltage Vdd for turning OFF a P-channel transistor.

[Layout Pattern]

Figure 2:
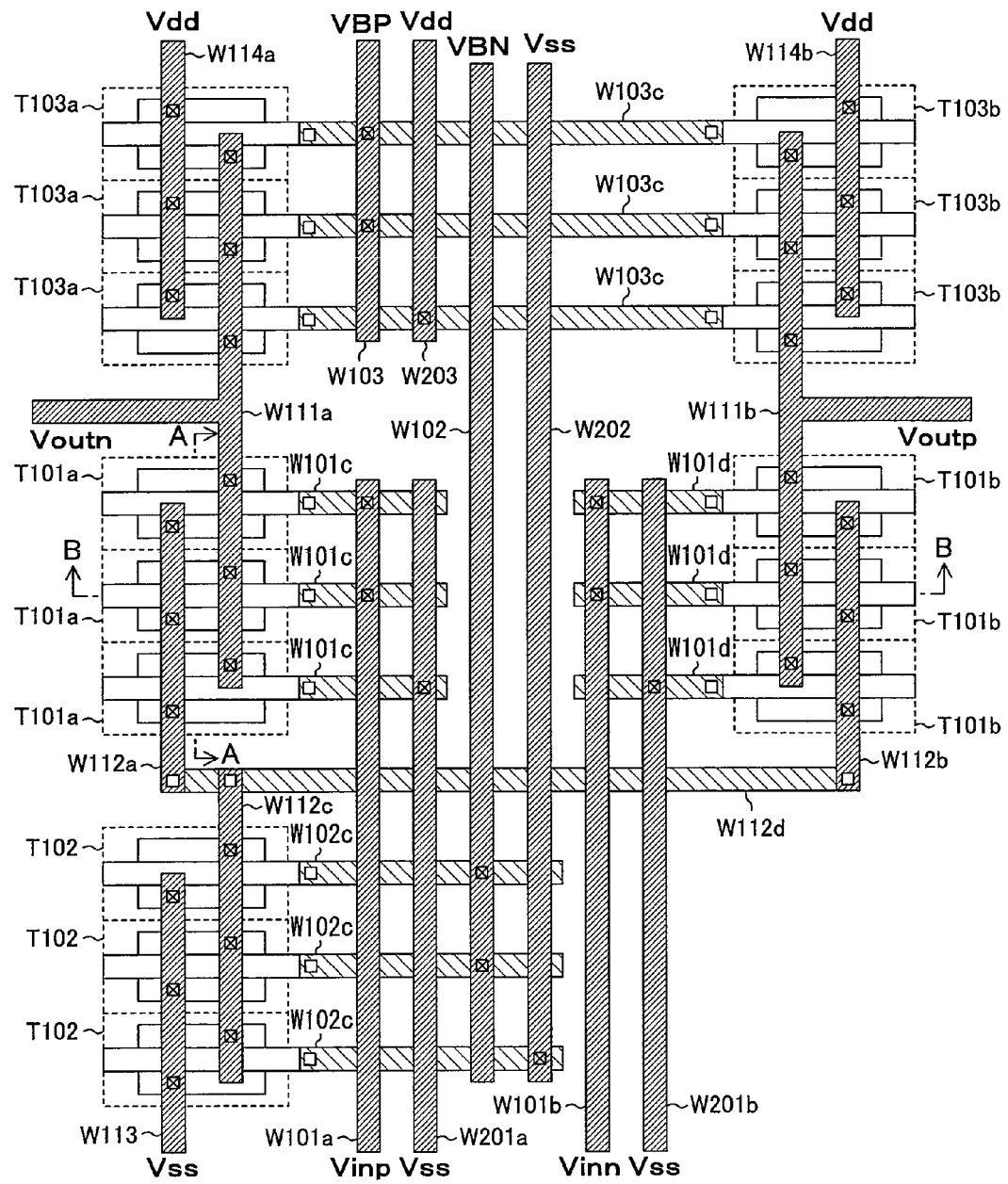
FIG. 2 shows a layout pattern of the operational amplifier of FIG. 1.
Figure 3:
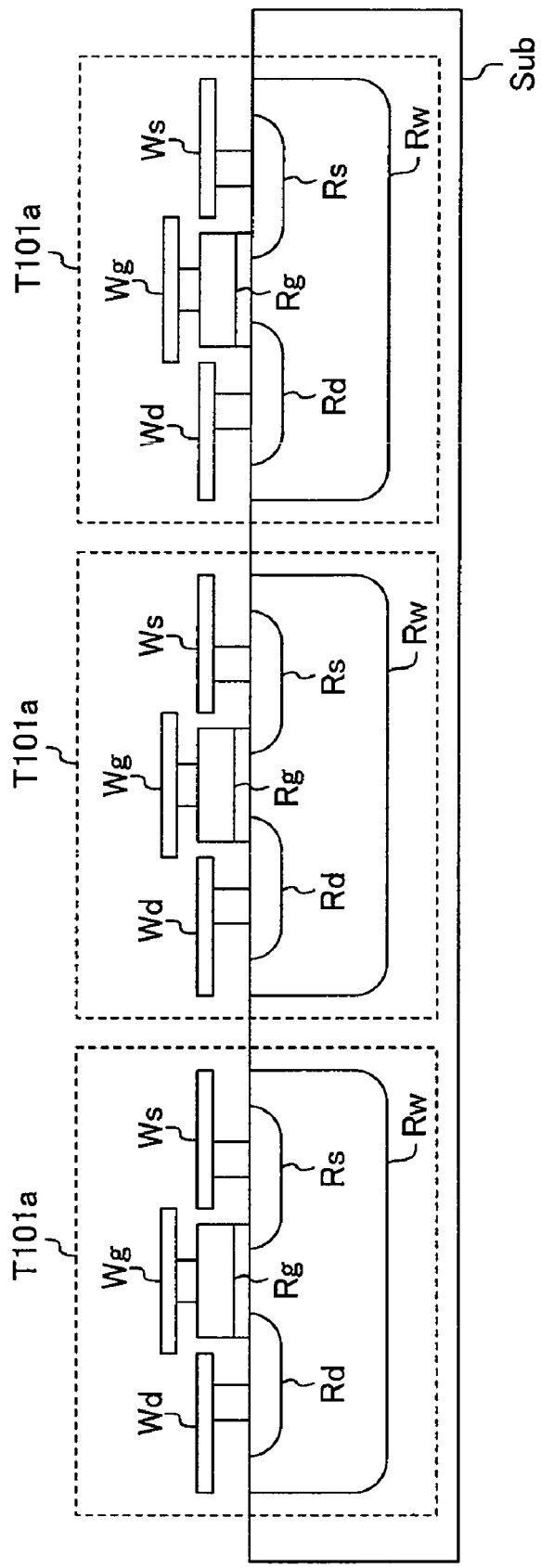
FIG. 3 is a cross-sectional view of the operational amplifier taken along line A-A in FIG. 2.
Figure 4:
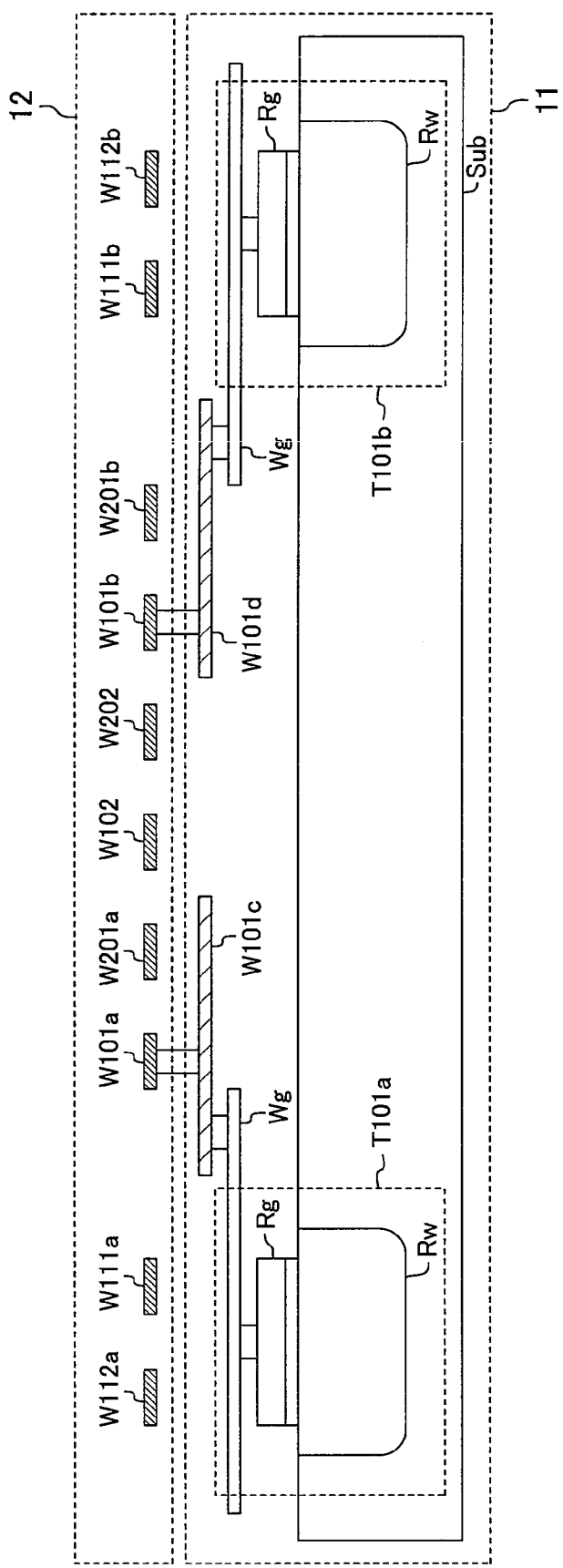
FIG. 4 is a cross-sectional view of the operational amplifier taken along line B-B in FIG. 2.

FIG. 2 shows a layout pattern of the operational amplifier 1. FIGS. 3 and 4 are cross-sectional views of the operational amplifier taken along line A-A and line B-B, respectively.

In an element formation layer 11 of the operational amplifier 1, formed are the differential transistors T101a, T101a, . . . , the differential transistors T101b, T101b, . . . , the current source transistors T102, T102, . . . , the load transistors T103a, T103a, . . . , the load transistors T103b, T103b, . . . , coupling interconnects W103c, W103c, . . . and drawing interconnects W101c, W101c, . . . , W101d, W101d, . . . , W102c, W102c, . . . .

In an interconnect layer 12 of the operational amplifier 1, formed are differential voltage interconnects W101a and W101b, bias voltage interconnects W102 and W103, output interconnects W111a and W111b, intermediate interconnects W112a, W112b, W112c and W112d, power supply interconnects W113, W114a and W114b, and OFF voltage interconnects W201a, W201b, W202 and W203.

[Transistor Structure]

Referring to FIGS. 3 and 4, the structures of the differential transistors T101a and T101b, the current source transistor T102, and the load transistors T103a and T103b will be described. Note that since these kinds of transistors are substantially the same in structure, the following description will be made taking the differential transistor T101a as an example.

As shown in FIG. 3, in the differential transistor T101a, a well region Rw is formed in a substrate Sub, and a source region Rs and a drain region Rd are formed in the well region Rw. A gate region Rg is formed on the well region Rw via a gate insulating film The gate region Rg, the source region Rs and the drain region Rd are electrically connected to a gate electrode Wg, a source electrode Ws and a drain electrode Wd, respectively, via respective vias. The differential transistors T101a, T101a, . . . are placed side by side so that the source region Rs of one transistor is adjacent to the drain region Rd of its adjacent transistor.

As shown in FIG. 4, the gate electrode Wg of the differential transistor T101a is electrically connected to the drawing interconnect W101c via a via. In other words, the drawing interconnect W101c is formed for extending the length of the gate electrode of the differential transistor T101a and thus can be considered as part of the gate electrode Wg of the differential transistor T101a. Likewise, the drawing interconnects W101d and W102c can be considered as part of the gate electrodes of the differential transistor T101b and the power supply transistor T102, respectively, and the coupling interconnect W103c can be considered as part of the gate electrodes of the load transistors T103a and T103b.

[Interconnect Structure for Gate Electrode]

As shown in FIG. 2, the differential voltage interconnect W101a extends from the input node receiving the input voltage Vinp so as to overlap the gate electrodes of the differential transistors T101a, T101a, . . . . Likewise, the differential voltage interconnect W101b extends from the input node receiving the input voltage Vinn so as to overlap the gate electrodes of the differential transistors T101b, T101b, . . . .

The bias voltage interconnect W102 extends from the bias node receiving the bias voltage VBN so as to overlap the gate electrodes of the current source transistors T102, T102, . . . . The bias voltage interconnect W103 extends from the bias node receiving the bias voltage VBP so as to overlap the coupling interconnects W103c, W103c, . . . (i.e., the gate electrodes of the load transistors T103a, T103a, . . . and the load transistors T103b, T103b, . . . ).

[Interconnect Structure for Source Electrode/Drain Electrode]

The output interconnect W111a electrically connects the drain electrodes of the differential transistors T101a, T101a, . . . and the drain electrodes of the load transistors T103a, T103a, . . . to an output node for outputting the output voltage Voutn. Likewise, the output interconnect W111b electrically connects the drain electrodes of the differential transistors T101b, T101b, . . . and the drain electrodes of the load transistors T103b, T103b, . . . to an output node for outputting the output voltage Voutp.

The intermediate interconnects W112a to W112d electrically connects the drain electrodes of the power supply transistors T102, T102, . . . to the source electrodes of the differential transistors T101a, T101a, . . . and the differential transistors T101b, T101b, . . . .

The power supply interconnect W113 electrically connects the source electrodes of the current source transistors T102, T102, . . . to a ground node receiving the ground voltage Vss. The power supply interconnects W114a and W114b electrically connect the source electrodes of the load transistors T103a, T103a, . . . and the source electrodes of the load transistors T103b, T103b, . . . , respectively, to a power supply node receiving the power supply voltage Vdd.

[OFF Voltage Interconnect]

The OFF voltage interconnect W201a extends from a ground node receiving the ground voltage Vss so as to overlap the gate electrodes of the differential transistors T101a, T101a, . . . . Likewise, the OFF voltage interconnect W201b extends from a ground node receiving the ground voltage Vss so as to overlap the gate electrodes of the differential transistors T101b, T101b, . . . .

The OFF voltage interconnect W202 extends from a ground node receiving the ground voltage Vss so as to overlap the gate electrodes of the current source transistors T102, T102, . . . . The OFF voltage interconnect W203 extends from a power supply node receiving the power supply voltage Vdd so as to overlap the coupling interconnects W103c, W103c, . . . (i.e., the gate electrodes of the load transistors T103a, T103a, . . . and the load transistors T103b, T103b, . . . ).

[Connection State Between Gate Electrode and Interconnect]

The gate electrode (drawing interconnect W101c in FIG. 2) of a differential transistor to be used, among the differential transistors T101a, T101a, . . . , is electrically connected to the differential voltage interconnect W101a, while the gate electrode of a differential transistor that is not used is electrically connected to the OFF voltage interconnect W201a. More specifically, a via is formed at the overlap between the gate electrode of the differential transistor T101a to be used and the differential voltage interconnect W101a, while a via is formed at the overlap between the gate electrode of the differential transistor T101a that is not used and the OFF voltage interconnect W201a.

Likewise, the gate electrode (drawing interconnect W101d in FIG. 2) of a differential transistor to be used, among the differential transistors T101b, T101b, . . . , is electrically connected to the differential voltage interconnect W101b, while the gate electrode of a differential transistor that is not used is electrically connected to the OFF voltage interconnect W201b.

The gate electrode (drawing interconnect W102c in FIG. 2) of a current source transistor to be used, among the current source transistors T102, T102, . . . , is electrically connected to the bias voltage interconnect W102, while the gate electrode of a current source transistor that is not used is electrically connected to the OFF voltage interconnect W202.

The gate electrodes (coupling interconnect W103c in FIG. 2) of load transistors to be used, among the load transistors T103a, T103a, . . . and the load transistors T103b, T103b, . . . , are electrically connected to the bias voltage interconnect W103, while the gate electrode of a load transistor that is not used is electrically connected to the OFF voltage interconnect W203.

As described above, only by changing the interconnect pattern in the interconnect layer 12 without the necessity of changing the configuration of the element formation layer 11, the circuit performance (e.g., the current drive capability, etc.) of the operational amplifier 1 can be arbitrarily changed. Hence, the number of design steps for the operational amplifier can be made smaller than in the conventional case of redesigning the operational amplifier from the placement of elements. The operational amplifier can therefore be provided with a short turnaround time (TAT), and thus the development cost can be reduced.

In particular, since all of the differential voltage interconnects W101a and W101b, the bias voltage interconnects W102 and W103 and the OFF voltage interconnects W201a, W201b, W202 and W203 are formed in the same interconnect layer 11, the circuit performance of the operational amplifier can be easily changed only by changing one interconnect layer. The interconnect layer 11 may be of a multilayer structure, not of the single-layer structure. For example, the differential voltage interconnects W101a and W101b and the bias voltage interconnects W102 and W103 may be formed in an interconnect layer different from an interconnect layer in which the OFF voltage interconnects W201a, W201b, W202 and W203 are formed.

Moreover, since the differential voltage interconnects W101a and W101b, the bias voltage interconnects W102 and W103 and the OFF voltage interconnects W201a, W201b, W202 and W203 overlap their corresponding gate electrodes, the connection states between the interconnects and the gate electrodes can be easily changed only by changing the via formation positions.

Also, a transistor that is not used can be in the OFF state by connecting the gate electrodes of such transistors to the OFF voltage nodes. Note that it is not necessarily required to connect the gate electrode of a transistor that is not used to the OFF voltage nodes, but the circuit performance of the operational amplifier 1 can be changed only by electrically connecting the gate electrode of a transistor to be used to its corresponding node (input node, bias node, etc.). That is, the gate electrode of a differential transistor 101a that is not used may be made open.

Alteration 1 of Embodiment 1

Figure 5:
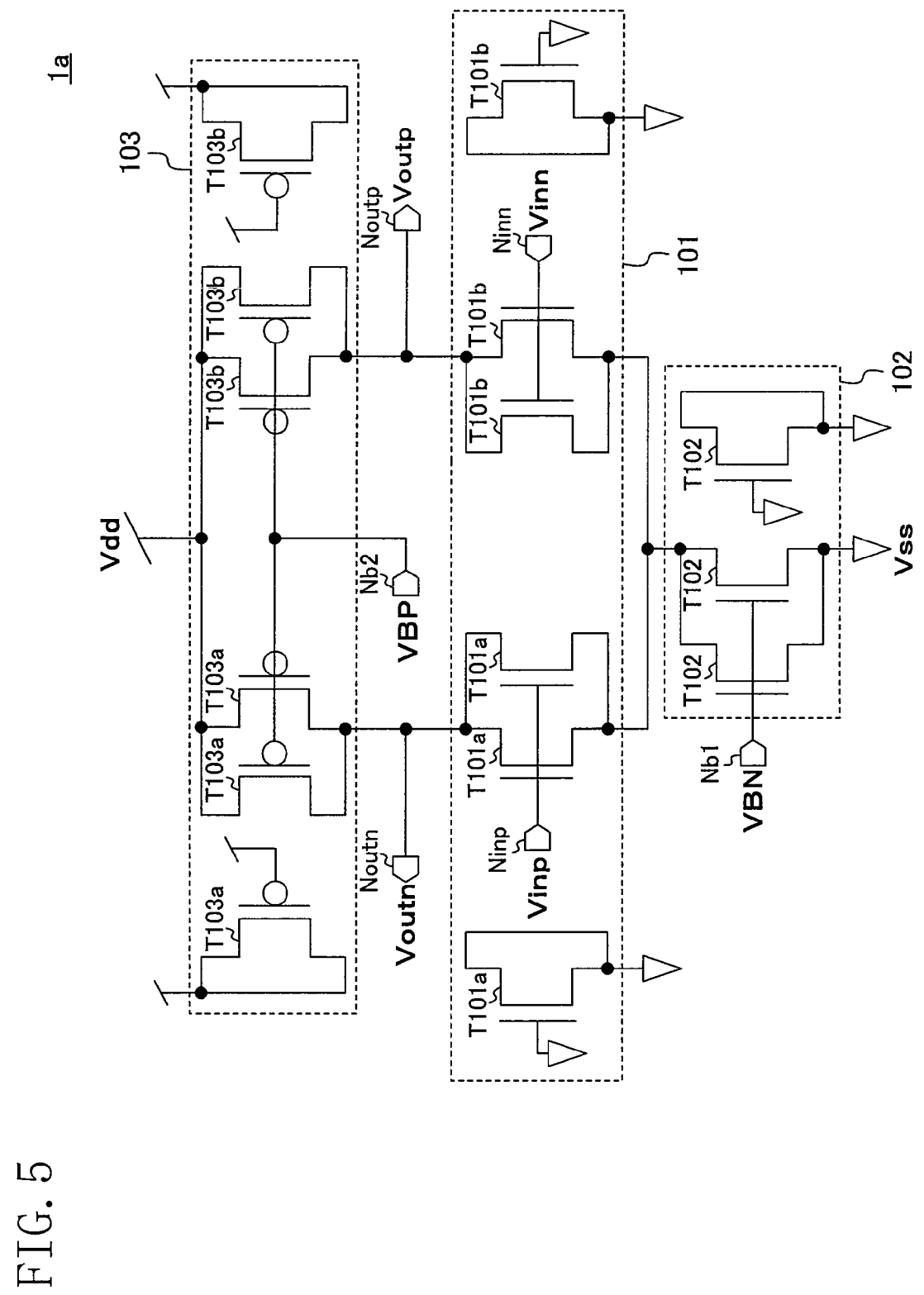
FIG. 5 is a circuit diagram of an operational amplifier of Alteration 1 of Embodiment 1 of the present invention.

As shown in FIG. 5, like the gate electrode of a transistor that is not used, the drain and source electrodes thereof may also be connected to an OFF voltage node in an auxiliary manner.

In an operational amplifier 1a of FIG. 5, the source and drain electrodes of a differential transistor that is not used, among the differential transistors T101a, T101a, . . . and the differential transistors T101b, T101b, . . . , is electrically connected to a ground node. The drain electrode of a current source transistor that is not used, among the current source transistors T102, T102, . . . , is electrically connected to a ground node. The drain electrode of a load transistor that is not used, among the load transistors T103a, T103a, and the load transistors T103b, T103b, . . . , is electrically connected to a power supply node.

[Layout Pattern]

Figure 6:
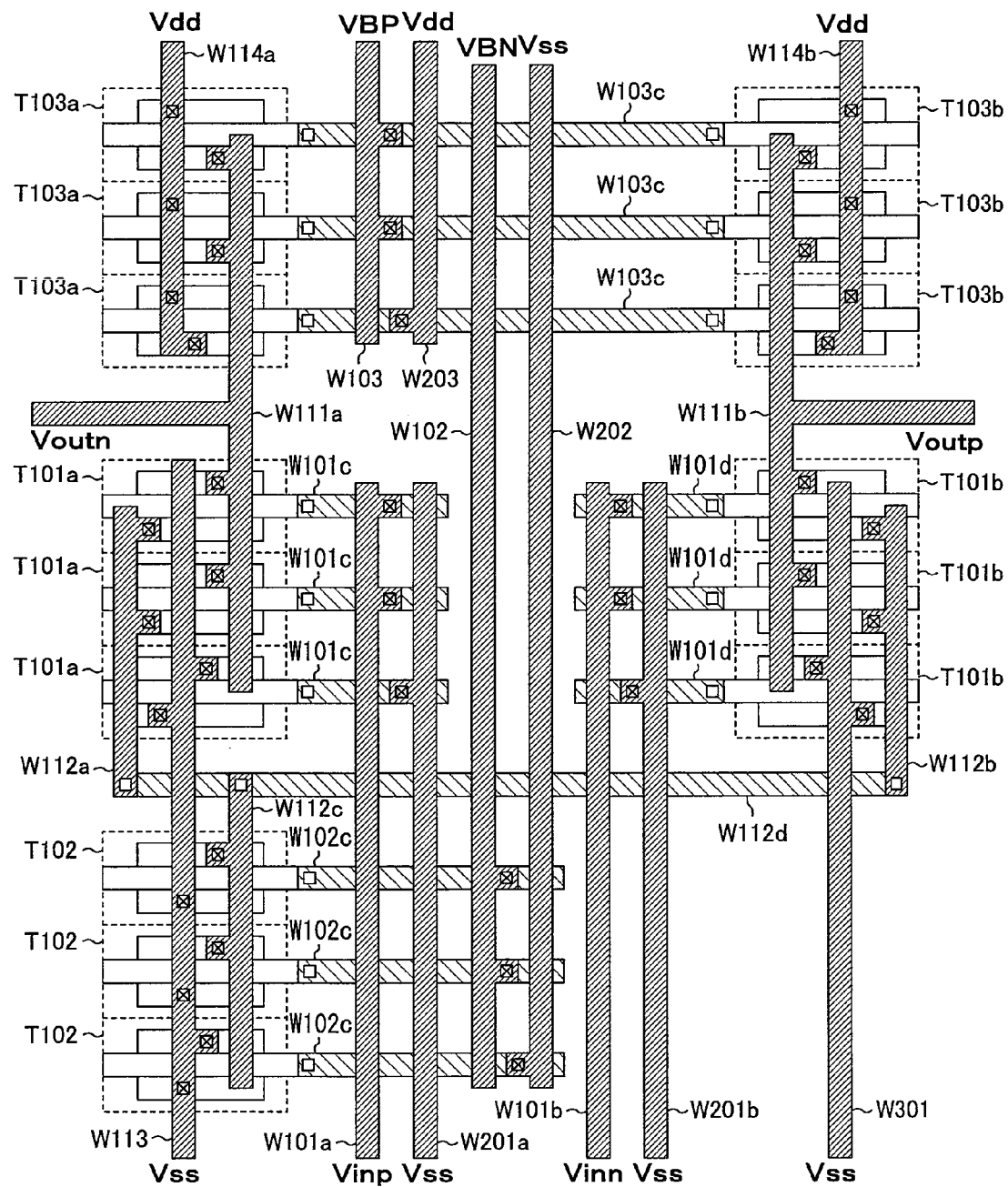
FIG. 6 shows a layout pattern of the operational amplifier of FIG. 5.

FIG. 6 shows a layout pattern of the operational amplifier 1a. In the interconnect layer 12 of the operational amplifier 1a of FIG. 6, formed is an auxiliary interconnect W301 in addition to the interconnects shown in FIG. 2. The configuration of the element formation layer 11 and the differential voltage interconnects W101a and W101b and the bias voltage interconnects W102 and W103 are substantially the same as those in FIG. 2. Note that in this alteration, for electrical connection between the interconnects and the electrodes, branches extend from the interconnects so as to overlap the electrodes and vias are formed at the branches.

[Interconnect Structure for Source Electrode/Drain Electrode]

The output interconnect W111a extend from the output node for outputting the output voltage Voutn so as to overlap the drain electrodes of the differential transistors T101a, T101a, . . . and the drain electrodes of the load transistors T103a, T103a, . . . . The output interconnect W111b extend from the output node for outputting the output voltage Voutp so as to overlap the drain electrodes of the differential transistors T101b, T101b, . . . and the drain electrodes of the load transistors T103b, T103b, . . . .

The intermediate interconnect W112a extends so as to overlap the source electrodes of the differential transistors T101a, T101a, . . . , the intermediate interconnect W112b extends so as to overlap the source electrodes of the differential transistors T101b, T101b, . . . , and the intermediate interconnect W112c extends so as to overlap the drain electrodes of the current source transistors T102, T102, . . . .

The auxiliary interconnect W301 extends from a ground node receiving the ground voltage Vss so as to overlap the drain and source electrodes of the differential transistors T101b, T101b, . . . .

The power supply interconnect W113 not only electrically connects the source electrodes of the current source transistors T102, T102, . . . to the ground node, but also extends from the ground node so as to overlap the drain and source electrodes of the differential transistors T101a, T101a, . . . and the drain electrodes of the current source transistors T102, T102, . . . .

The power supply interconnect W114a not only electrically connects the source electrodes of the load transistors T103a, T103a, . . . to the power supply node, but also extends from the power supply node so as to overlap the drain electrodes of the load transistors T103a, T103a, . . . . Likewise, the power supply interconnect W114b not only electrically connects the source electrodes of the load transistors T103b, T103b, . . . to the power supply node, but also extends from the power supply node so as to overlap the drain electrodes of the load transistors T103b, T103b, . . . .

[Connection State Between Drain/Source Electrodes and Interconnect]

The drain electrode of a differential transistor be used, among the differential transistors T101a, T101a, . . . , is electrically connected to the output interconnect W111a, and the source electrode thereof is electrically connected to the intermediate interconnect W112a. On the contrary, the drain and source electrodes of a differential transistor T101a that is not used are electrically connected to the power supply interconnect W113. More specifically, vias are respectively formed at the overlap between the drain electrode of the differential transistor T101a to be used and the output interconnect W111a, at the overlap between the source electrode of the differential transistor T101a to be used and the intermediate interconnect W112a, at the overlap between the drain electrode of the differential transistor T101a that is not used and the power supply interconnect W113, and at the overlap between the source electrode of the differential transistor T101a that is not used and the power supply interconnect W113.

The drain electrode of a differential transistor to be used, among the differential transistors T101b, T101b, . . . , is electrically connected to the output interconnect W111b, and the source electrode thereof is electrically connected to the intermediate interconnect W112b. On the contrary, the drain and source electrodes of a differential transistor T101b that is not used are electrically connected to the auxiliary interconnect W301.

The drain electrode of a current source transistor to be used, among the current source transistors T102, T102, . . . , is electrically connected to the intermediate interconnect W112c. On the contrary, the drain electrode of a current source transistor T102 that is not used is electrically connected to the power supply interconnect W113.

The drain electrode of a load transistor to be used, among the load transistors T103a, T103a, . . . , is electrically connected to the output interconnect W111a. On the contrary, the drain electrode of a load transistor T103a that is not used is electrically connected to the power supply interconnect W114a.

The drain electrode of a load source transistor to be used, among the load transistors T103b, T103b, . . . , is electrically connected to the output interconnect W111b. On the contrary, the drain electrode of a load transistor T103b that is not used is electrically connected to the power supply interconnect W114b.

As described above, by connecting the drain and source electrodes of a transistor that is not used to the OFF voltage nodes in an auxiliary manner, the parasitic capacitance of the transistor that is not used is isolated from the transistors to be used, and hence the effect of such parasitic capacitance on the frequency characteristic of the operational amplifier can be removed.

Moreover, since the interconnects overlap their corresponding drain (or source) electrodes, the connection states between the interconnects and the drain (or source) electrodes can be easily changed only by changing the via formation positions.

Alteration 2 of Embodiment 1

Figure 7:
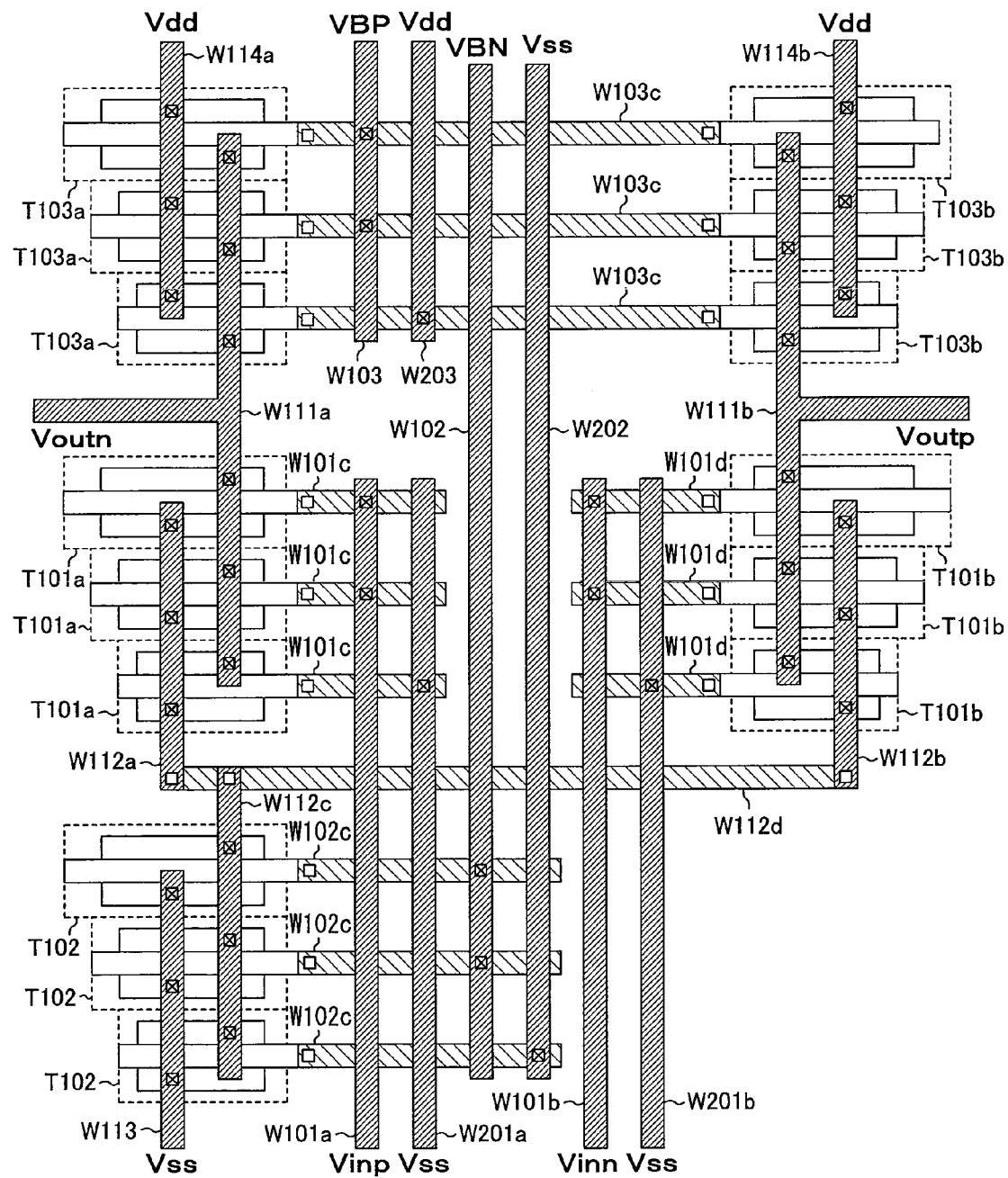
FIG. 7 shows a layout pattern of an operational amplifier of Alteration 2 of Embodiment 1 of the present invention.

As shown in FIG. 7, the differential transistors T101a, T101a, . . . may be different in at least one of gate length and gate width from one another (different in gate width in FIG. 7). This also applies to the differential transistors T101b, T101b, . . . , the current source transistors T102, T102, . . . , the load transistors T103a, T103a, . . . and the load transistors T103b, T103b, . . . .

Alteration 3 of Embodiment 1

Figure 8:
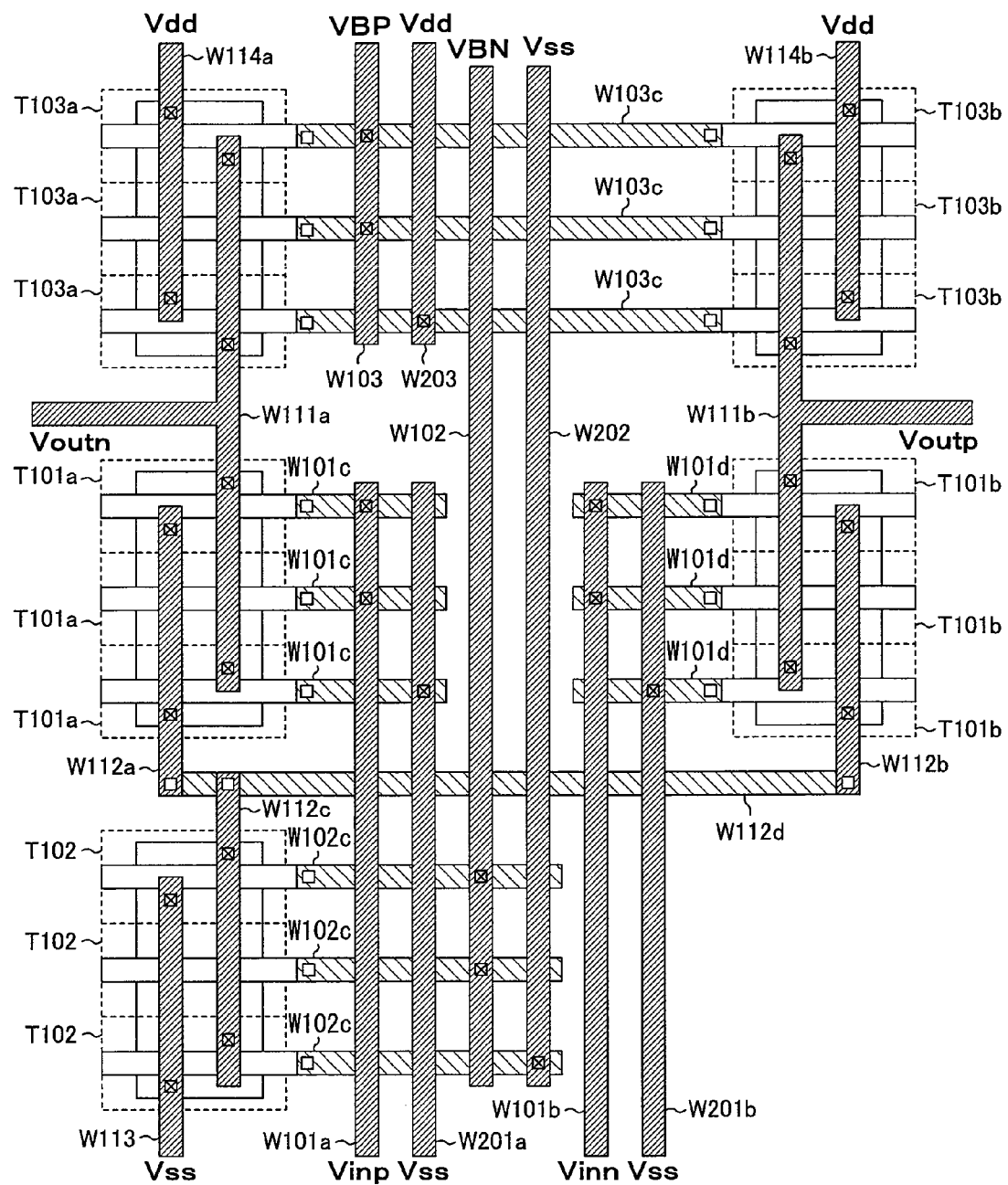
FIG. 8 shows a layout pattern of an operational amplifier of Alteration 3 of Embodiment 1 of the present invention.

Alternatively, as shown in FIG. 8, every adjacent source electrode and drain electrode of the differential transistors T101a, T101a, . . . placed side by side may be made common. This also applies to the differential transistors T101b, T101b, . . . , the current source transistors T102, T102, . . . , the load transistors T103a, T103a, . . . and the load transistors T103b, T103b, . . . .

Embodiment 2

Figure 9:
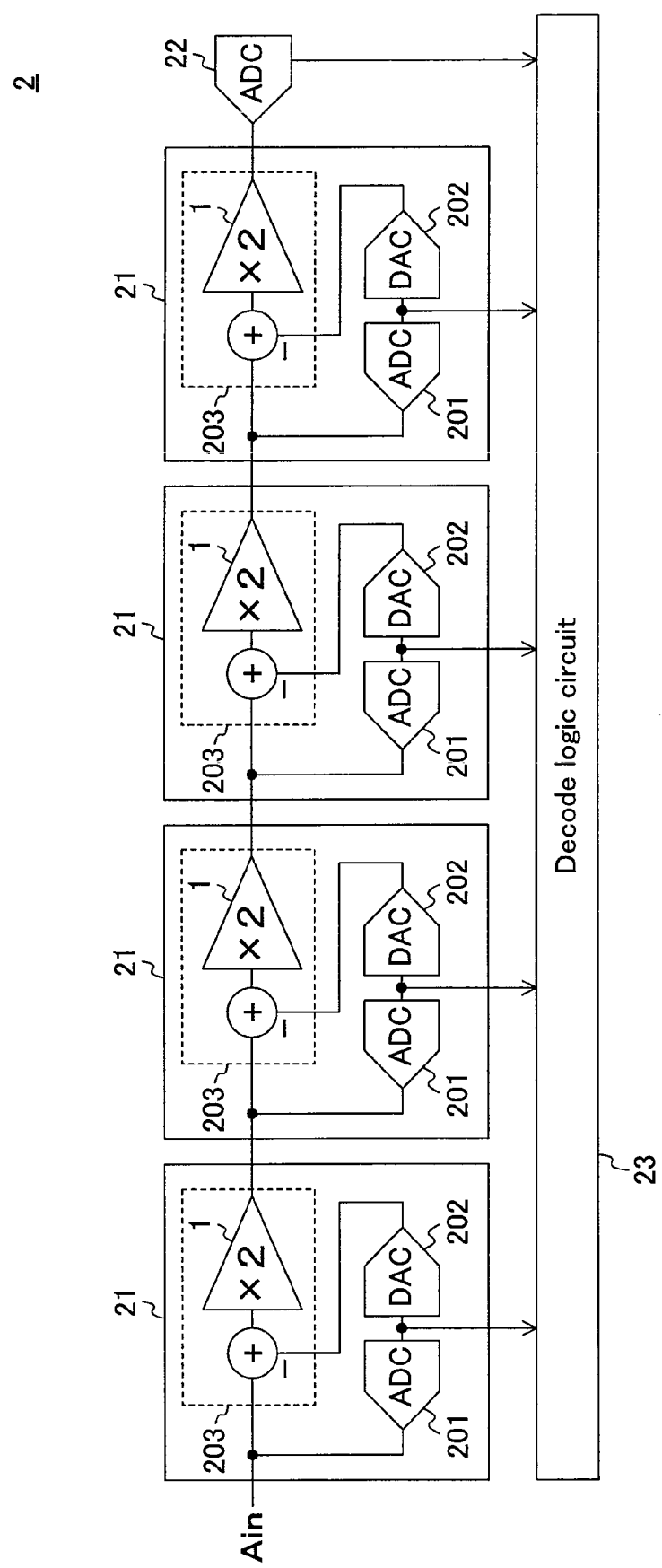
FIG. 9 is a circuit diagram of a pipeline AD converter of Embodiment 2 of the present invention.

FIG. 9 shows a configuration of a pipeline AD converter of Embodiment 2 of the present invention. The pipeline AD converter 2 of this embodiment sequentially executes analog-digital conversion and amplification of a residual voltage, to thereby convert a differential voltage Ain to digital data bit by bit. The pipeline AD converter 2 includes a plurality of conversion stages 21, 21, . . . in cascade connection, a sub-AD conversion circuit 22 and a decode logic circuit 23.

The conversion stages 21, 21, . . . execute analog-digital conversion processing and operational amplification processing alternately. During the analog-digital conversion processing, each of the conversion stages 21, 21, . . . outputs a digital value based on the differential voltage (input differential voltage) from the preceding stage and also samples the input differential voltage. During the operational amplification processing, each of the conversion stages 21, 21, . . . outputs an output differential voltage to the next stage based on the sampled input differential voltage and an intermediate differential voltage corresponding to the digital value. Each of the conversion stages 21, 21, . . . includes the operational amplifier 1 shown in FIG. 1.

The sub-AD conversion circuit 22 converts the output differential voltage from the final-stage conversion stage 21 to a digital value at a resolution of 2 bits.

The decode logic circuit 23 converts the digital values obtained in the conversion stages 21, 21, . . . and the sub-AD conversion circuit 22 to one binary digital data.

[Conversion Stage]

Figure 10:
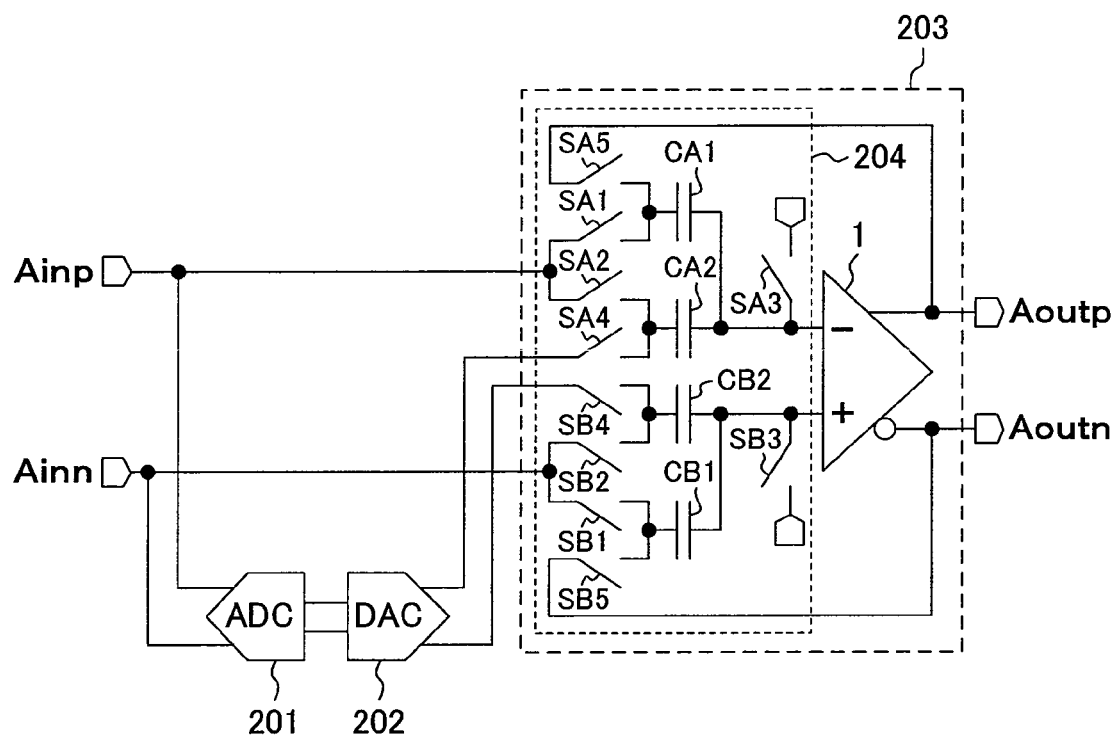
FIG. 10 is a circuit diagram of a conversion stage shown in FIG. 9.

FIG. 10 shows a configuration of one conversion stage 21 shown in FIG. 9. The conversion stage 21 includes an analog-digital conversion circuit (ADC) 201, a digital-analog conversion circuit (DAC) 202 and an operation circuit 203.

The analog-digital conversion circuit 201 converts a differential voltage (input differential voltage from the preceding stage) composed of input voltages Ainp and Ainn to a digital value at a resolution of 1.5 bits. In other words, the digital value is any one of three values (e.g., −1, 0 and +1).

The digital-analog conversion circuit 202 converts the digital value obtained by the analog-digital conversion circuit 201 to an intermediate differential voltage. For example, the digital-analog conversion circuit 202 outputs a reference voltage, out of three reference voltages, corresponding to the digital value.

The operation circuit 203 samples the input differential voltage, and also mixes the sampled input differential voltage with the intermediate differential voltage obtained by the digital-analog conversion circuit 202, amplifies a differential voltage obtained by the mixture (mixed differential voltage) and outputs the amplified differential voltage to the next stage as an output differential voltage composed of output voltages Aoutp and Aoutn. In the illustrated example, the difference between the input differential voltage and the intermediate differential voltage is doubled and then outputted.

The operation circuit 203 includes a capacitance section 204 and the operational amplifier 1. The capacitance section, which samples the input differential voltage, includes capacitors CA1, CA2, CB1 and CB2 and switches SA1 to SA5 and SB1 to SB5. The operational amplifier 1 amplifies the mixed differential voltage of the input differential voltage sampled by the capacitance section 204 and the intermediate differential voltage obtained by the digital-analog conversion circuit 202.

During the analog-digital conversion processing, the switches SA1, SA2 and SA3 are ON while the switches SA4 and SA5 are OFF. With this, the input voltage Ainp is sampled in the capacitors CA1 and CA2. Likewise, the switches SB1, SB2 and SB3 are ON while the switches SB4 and SB5 are OFF. With this, the input voltage Ainn is sampled in the capacitors CB1 and CB2.

During the operational amplification processing, the switches SA1, SA2 and SA3 are OFF while the switches SA4 and SA5 are ON. With this, the mixed differential voltage of the input voltage Ainp sampled in the capacitors CA1 and CA2 and the intermediate differential voltage obtained by the digital-analog conversion circuit 202 is amplified by the operational amplifier 1. Likewise, the switches SB1, SB2 and SB3 are OFF while the switches SB4 and SB5 are ON. With this, the mixed differential voltage of the input voltage Ainn sampled in the capacitors CB1 and CB2 and the intermediate differential voltage obtained by the digital-analog conversion circuit 202 is amplified by the operational amplifier 1.

[Configuration of Operational Amplifier]

The operational amplifiers 1 included in the conversion stages 21, 21, . . . are the same in the configuration of the element formation layer 11, but are different from one another in the configuration of the interconnect layer 12. In other words, the interconnect layer of the operational amplifier of each of the conversion stages 21, 21, . . . is individually designed so that the current drive capability of the operational amplifier is of a desired amount in each of the conversion stages 21, 21, . . . .

As described above, only by changing the interconnect pattern in the interconnect layer, the circuit performance of the operational amplifier included in each of the conversion stages 21, 21, . . . can be arbitrarily set. Hence, the number of design steps for the pipeline AD converter can be made smaller than in the conventional case. For example, if only a layout pattern is prepared for the first conversion stage by executing the device placement step, the wiring step and the rule verification step, only the wiring step and the rule verification step may just be executed without the necessity of executing the device placement step for the second and subsequent conversion stages. In this way, the pipeline AD converter can be provided with a short turnaround time (TAT).

[Design of a Plurality of Pipeline AD Converters]

In designing of a plurality of pipeline AD converters, once the layout pattern of an operational amplifier has been prepared for the first pipeline AD converter, the second and subsequent pipeline AD converters can be designed by only changing the interconnect pattern in the interconnect layer without the necessity of changing the placement of elements. Hence, the number of design steps for the pipeline AD converter can be further reduced.

Figure 11:
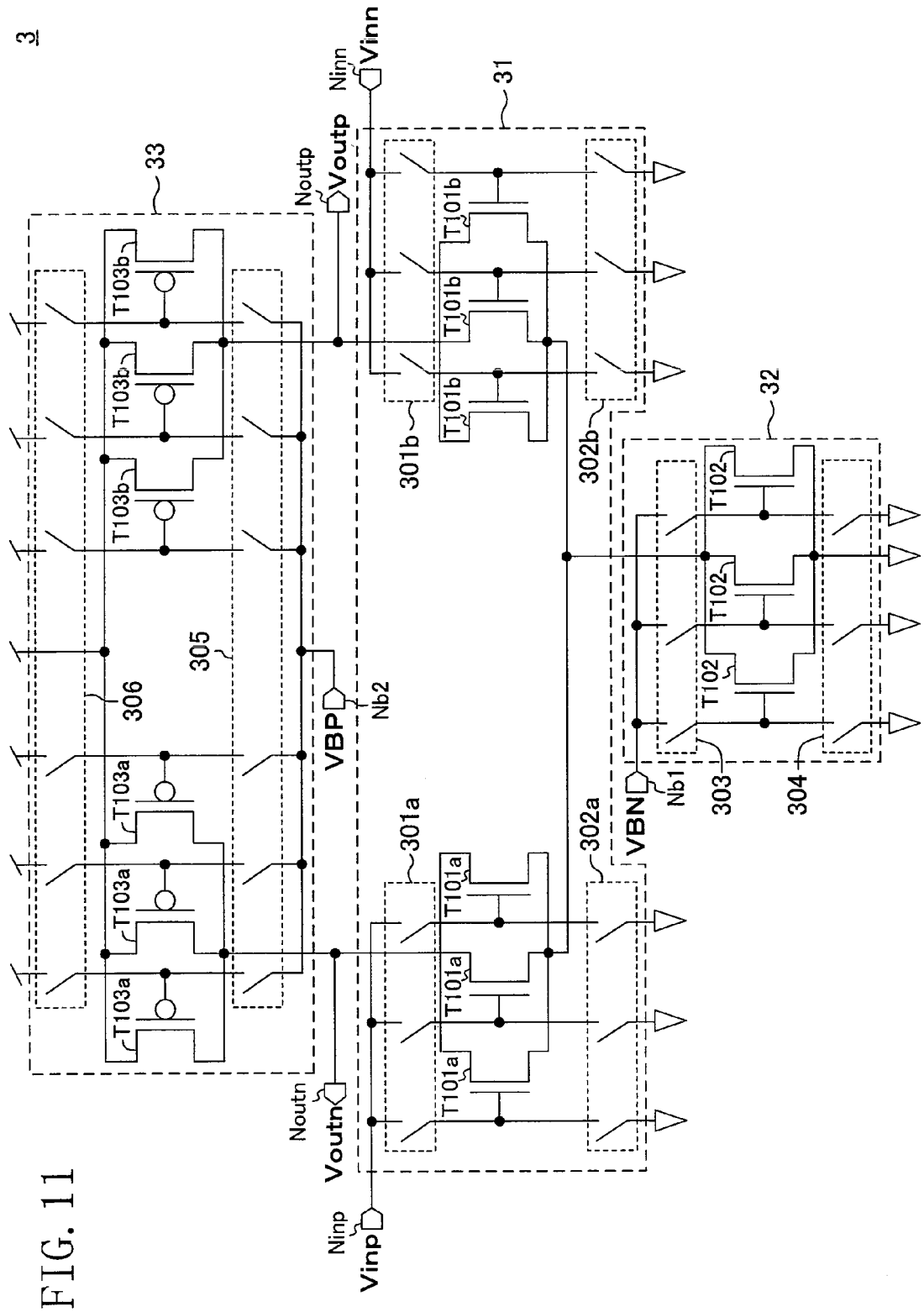
FIG. 11 is a circuit diagram of an operational amplifier of Embodiment 3 of the present invention.

Embodiment 3 is FIG. 11 shows a configuration of an operational converter of Embodiment 3 of the present invention. The operational converter 3 of this embodiment includes a differential section 31, a current adjustment section 32 and an active load section 33.

[Differential Section]

The differential section 31 includes differential transistors T101a, T101a, . . . , differential transistors T101b, T101b, . . . and connection switch portions 301a, 302a, 301b and 302b.

The connection switch portion 301a switches the connection states between the gate electrodes of the differential transistors T101a, T101a, . . . and an input node Ninp. The connection switch portion 302a switches the connection states between the gate electrodes of the differential transistors T101a, T101a, . . . and a ground node.

The connection switch portion 301b switches the connection states between the gate electrodes of the differential transistors T101b, T101b, . . . and an input node Ninn. The connection switch portion 302b switches the connection states between the gate electrodes of the differential transistors T101b, T101b, . . . and a ground node.

[Current Adjustment Section]

The current adjustment section 32 includes current source transistors T102, T102, . . . and connection switch portions 303 and 304.

The connection switch portion 303 switches the connection states between the gate electrodes of the current source transistors T102, T102, . . . and a bias node Nb1, and the connection switch portion 304 switches the connection states between the gate electrodes of the current source transistors T102, T102, . . . and a ground node.

[Active Load Section]

The active load section 33 includes load transistors T103a, T103a, . . . , load transistors T103b, T103b, . . . and connection switch portions 305 and 306.

The connection switch portion 305 switches the connection states between the gate electrodes of the load transistors T103a, T103a, . . . and T103b, T103b, . . . and a bias node Nb2, and the connection switch portion 306 switches the connection states between the gate electrodes of the load transistors T103a, T103a, . . . and T103b, T103b, . . . and a power supply node.

[Connection State of Gate Electrode]

The gate electrode of a differential transistor to be used, among the differential transistors T101a, T101a, . . . , is electrically connected to the input node Ninp via the connection switch portion 301a, and the gate electrode of a differential transistor that is not used is electrically connected to the ground node via the connection switch portion 302a.

The gate electrode of a differential transistor to be used, among the differential transistors T101b, T101b, . . . , is electrically connected to the input node Ninn via the switch portion 301b, and the gate electrode of a differential transistor that is not used is electrically connected to the ground node via the connection switch portion 302b.

The gate electrode of a current source transistor to be used, among the current source transistors T102, T102, . . . , is electrically connected to the bias node Nb1 via the connection switch portion 303, and the gate electrode of a current source transistor that is not used is electrically connected to the ground node via the connection switch portion 304.

The gate electrodes of load transistors to be used, among the load transistors T103a, T103a, . . . and load transistors T103b, T103b, . . . , are electrically connected to the bias node Nb2 via the connection switch portion 305, and the gate electrode of a load transistor that is not used is electrically connected to the power supply node via the connection switch portion 306.

As described above, by switching the connection destinations for the gate electrodes by means of the connection switch portions, the circuit performance of the operational amplifier can be arbitrarily set without the necessity of changing the configuration of the operational amplifier. Hence, the number of design steps for the operational amplifier can be made smaller than in the conventional case (redesigning from the placement of elements), and thus the operational amplifier can be provided with a short TAT.

[Pipeline AD Converter]

The pipeline AD converter 2 of FIG. 9 may include the operational amplifier 3 of FIG. 11 in place of the operational amplifier 1. In this case, the operational amplifiers 3 included in the conversion stages 21 are all the same in configuration. Hence, with no need to design the operational amplifier individually for each conversion stage, the number of design steps for the pipeline AD converter can be made smaller than in the conventional case.

Embodiment 4

Figure 12:
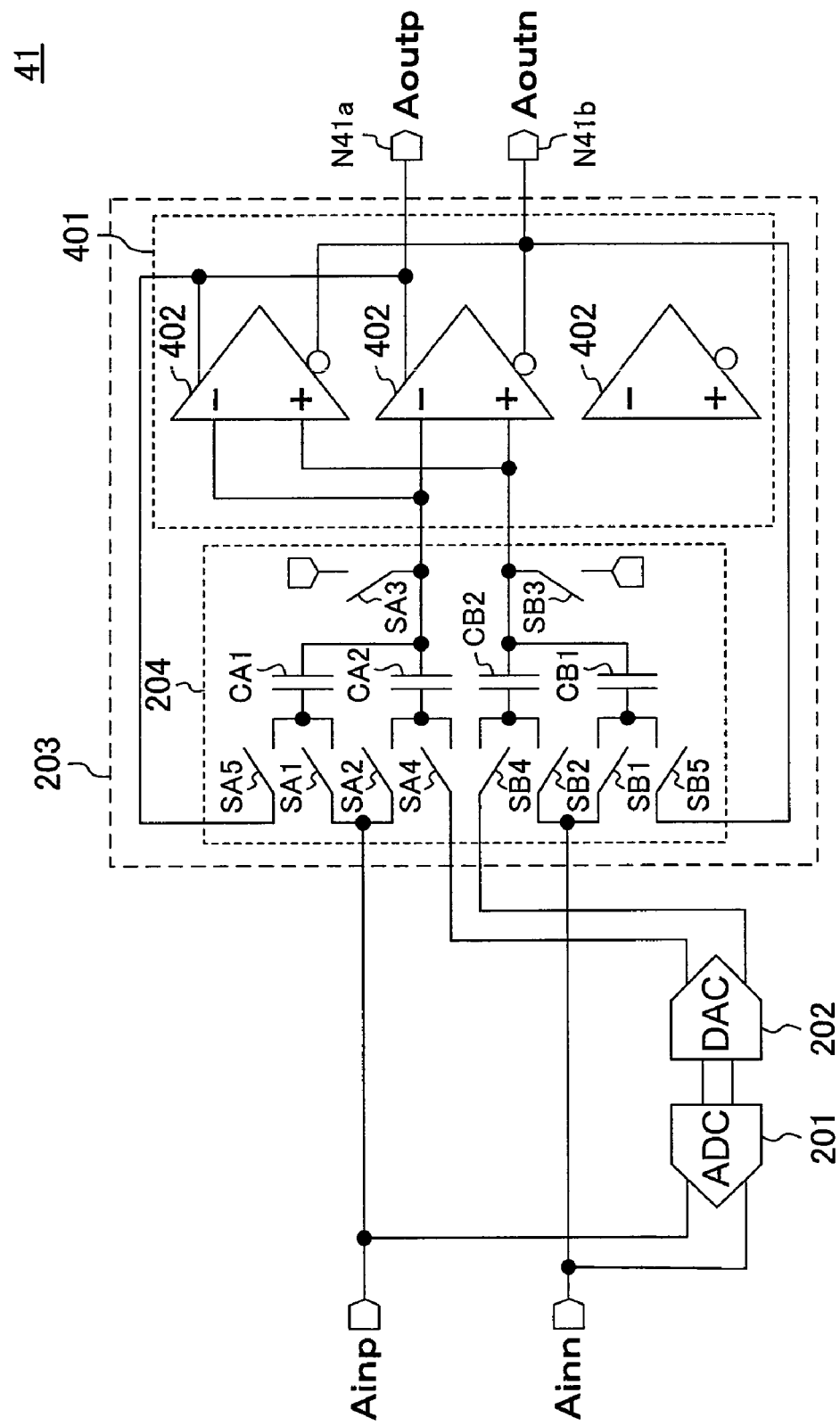
FIG. 12 is a circuit diagram of a conversion stage in Embodiment 4 of the present invention.

The pipeline AD converter of Embodiment 4 of the present invention includes conversion stages 41, 41, ... shown in FIG. 12 in place of the conversion stages 21, 21, ... shown in FIG. 9. The other configuration of the pipeline AD converter of this embodiment is the same as that of FIG. 9.

The conversion stage 41 of FIG. 12 includes a differential amplification section 401 in place of the operational amplifier 1 shown in FIG. 10. The other configuration of the conversion stage 41 is the same as that of FIG. 10. The differential amplification section 401 is composed of a plurality of operational amplifiers 402, 402, ... having the same configuration. The operational amplifiers 402, 402, . . . are formed for amplifying the mixed differential voltage of the input differential voltage sampled by the capacitance section 204 and the intermediate differential voltage obtained by the digital-analog conversion circuit 202.

[Connection State of Operational Amplifier]

The input terminal pair of an operational amplifier to be used, among the operational amplifiers 402, 402, ..., are electrically connected to the capacitance section 203 via input interconnects, and the output terminal pair thereof are electrically connected to output node pair (N41a and N41b) via output interconnects.

As described above, the circuit performance of the conversion stage can be arbitrarily set only by changing the interconnect pattern without the necessity of changing the placement of elements. Hence, the number of design steps of the pipeline AD converter can be made smaller than in the conventional case, and thus the pipeline AD converter can be provided with a short TAT.

Embodiment 5

Figure 13:
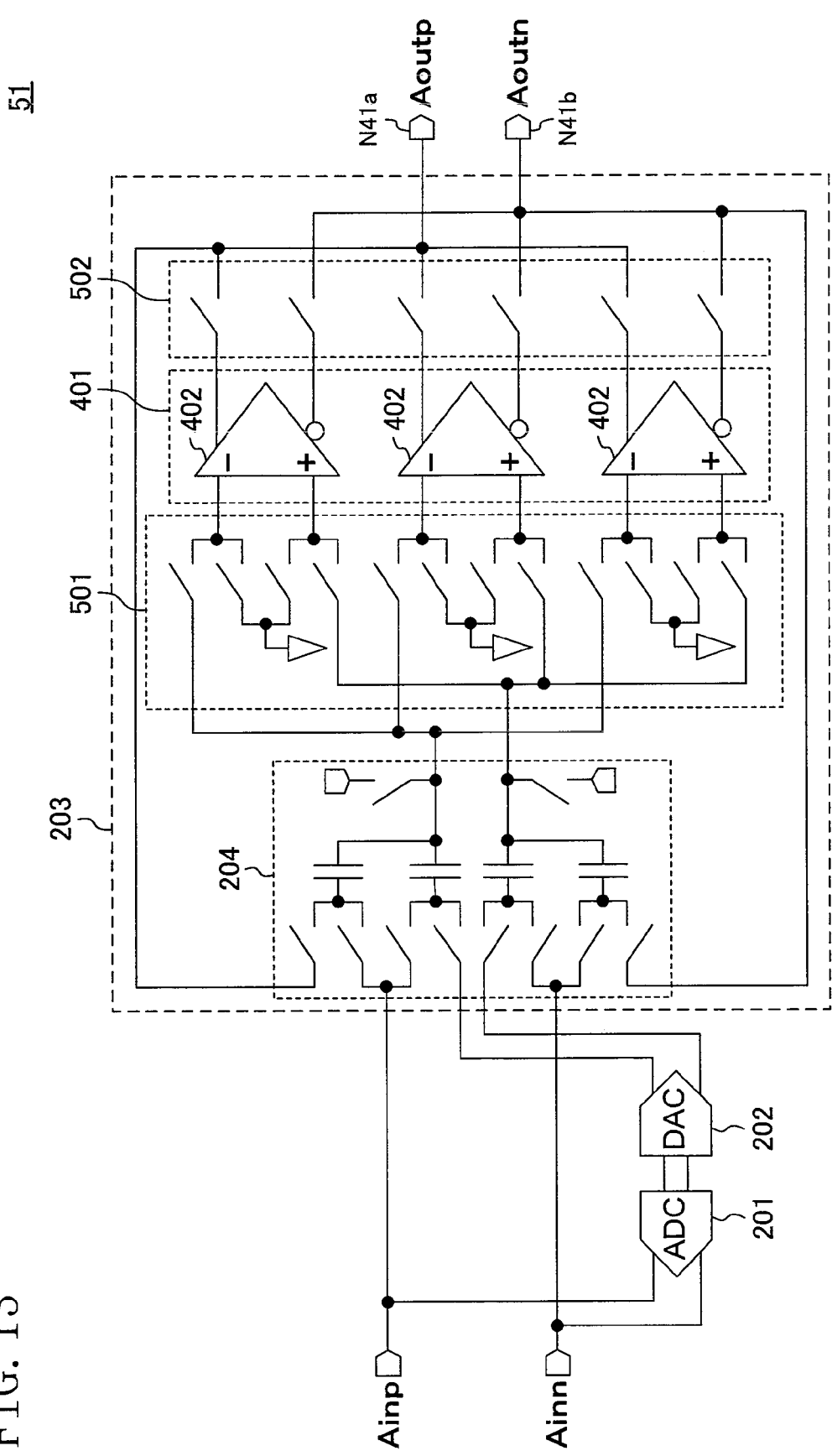
FIG. 13 is a circuit diagram of a conversion stage in Embodiment 5 of the present invention.
Figure 14:
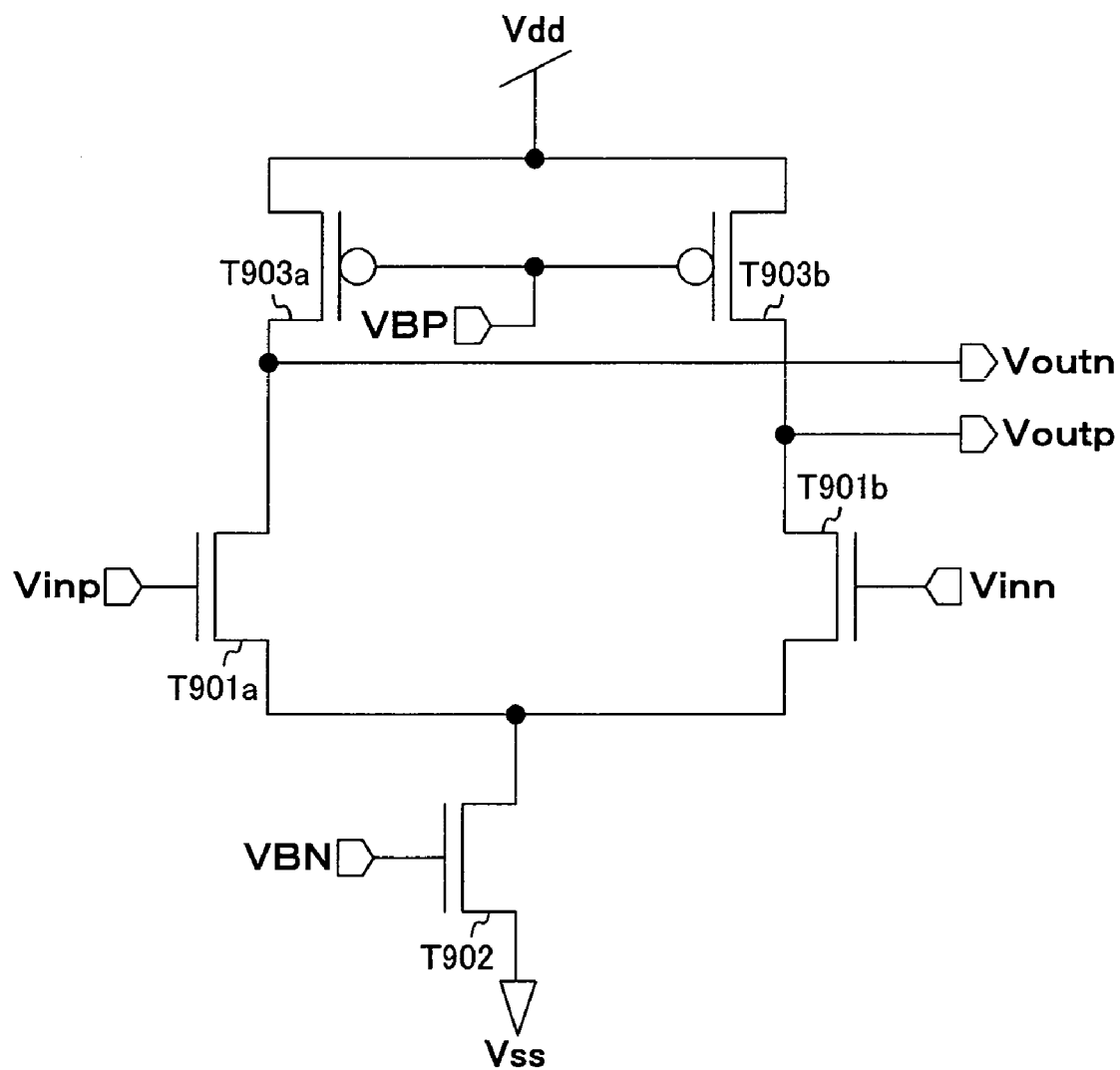
FIG. 14 is a circuit diagram of a conventional operational amplifier.
Figure 15:
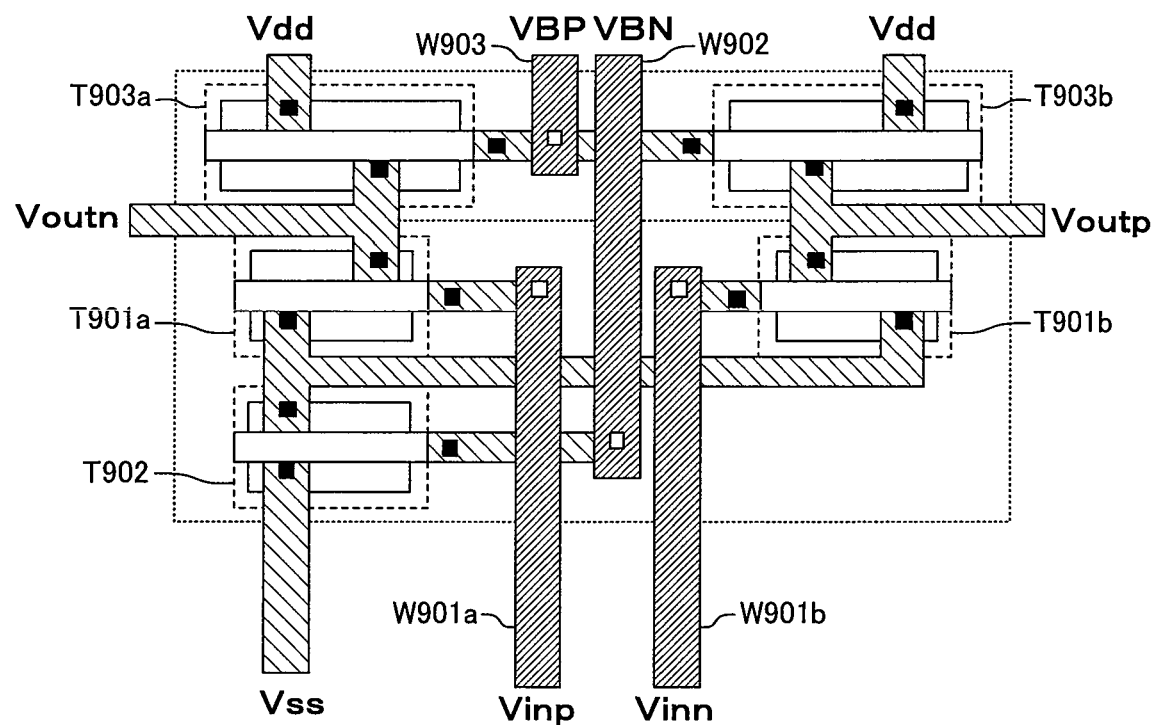
FIG. 15 shows a layout pattern of the operational amplifier of FIG. 14.

The pipeline AD converter of Embodiment 5 of the present invention includes conversion stages 51, 51, ... shown in FIG. 13 in place of the conversion stages 21, 21, ... shown in FIG. 9. The other configuration of the pipeline AD converter of this embodiment is the same as that of FIG. 9. The conversion stage 51 of FIG. 13 includes an input connection switch section 501 and an output connection switch section 502 in addition to the configuration shown in FIG. 12.

The input connection switch section 501 switches the connection destinations for the input terminal pairs of the operational amplifiers 402, 402, . . . . The input connection switch section 501 electrically connects the input terminal pair of an operational amplifier to be used, among the operational amplifiers 402, 402, ..., to the capacitance section 204 and electrically connects the input terminal pair of an operational amplifier that is not used to a ground node.

The output connection switch section 502 switches the connection states between the output terminal pairs of the operational amplifiers 402, 402, ... and the output node pair (N41a and N41b). The output connection switch section 502 electrically connects the output terminal pair of an operational amplifier to be used, among the operational amplifiers 402, 402, ..., to the output node pair and electrically disconnects the output terminal pair of an operational amplifier that is not used from the output node pair.

As described above, by switching the connection states of the operational amplifiers 402, 402, ... by means of the input connection switch section 501 and the output connection switch section 502, the circuit performance of the conversion stage can be arbitrarily set without the necessity of changing the configuration of the conversion stage. Hence, the number of design steps for the pipeline AD converter can be made smaller than in the conventional case, and thus the pipeline AD converter can be provided with a short TAT.

INDUSTRIAL APPLICABILITY

As described above, the operational amplifier circuit and the pipeline AD converter according to the present invention, in which the number of design steps for changing the circuit performance is smaller than in the conventional case, are useful as mixed analog/digital semiconductor integrated circuits (e.g., semiconductor integrated circuits used for video signal processing for cameras, TV sets and videos, communication signal processing for wireless LAN and the like, and the digital read channel technology for DVDs and the like).

The invention claimed is:

1. An operational amplifier comprising:
    an element formation layer including a differential section for converting a differential voltage composed of first and second input voltages to a current pair, a current adjustment section for adjusting the current amount supplied to the differential section, and an active load section for receiving the current pair from the differential section; and
    an interconnect layer formed on the element formation layer, the interconnect layer including first and second differential voltage interconnects and first and second bias voltage interconnects,
    wherein the differential section includes a plurality of first and second differential transistors having a first polarity,
    the current adjustment section includes a plurality of current source transistors having the first polarity,
    the active load section includes a plurality of first and second load transistors having a second polarity reverse to the first polarity,
    the first differential voltage interconnect electrically connects a gate electrode of a transistor to be used among the plurality of first differential transistors to a first input node receiving the first input voltage,
    the second differential voltage interconnect electrically connects a gate electrode of a transistor to be used among the plurality of second differential transistors to a second input node receiving the second input voltage,
    the first bias voltage interconnect electrically connects a gate electrode of a transistor to be used among the plurality of current source transistors to a first bias node receiving a first bias voltage for turning ON a transistor having the first polarity, and
    the second bias voltage interconnect electrically connects gate electrodes of transistors to be used among the plurality of first and second load transistors to a second bias node receiving a second bias voltage for turning ON a transistor having the second polarity.

2. The operational amplifier of claim 1, wherein the interconnect layer further includes:
a first OFF voltage interconnect for electrically connecting a gate electrode of a transistor that is not used among the plurality of first and second differential transistors and the plurality of current source transistors to a first OFF voltage node receiving a first OFF voltage for turning OFF a transistor having the first polarity, and
a second OFF voltage interconnect for electrically connecting a gate electrode of a transistor that is not used among the plurality of first and second load transistors to a second OFF voltage node receiving a second OFF voltage for turning OFF a transistor having the second polarity.

3. The operational amplifier of claim 2, wherein the interconnect layer further includes:
a first output interconnect for electrically connecting a drain electrode of a transistor to be used among the plurality of first load transistors and a drain electrode of a transistor to be used among the plurality of first differential transistors to a first output node,
a second output interconnect for electrically connecting a drain electrode of a transistor to be used among the plurality of second load transistors and a drain electrode of a transistor to be used among the plurality of second differential transistors to a second output node, and
an intermediate interconnect for electrically connecting a drain electrode of a transistor to be used among the plurality of current source transistors to a source electrode of a transistor to be used among the plurality of first and second differential transistors.

4. The operational amplifier of claim 3, wherein the interconnect layer further includes:
a first auxiliary interconnect for electrically connecting a source electrode and drain electrode of a transistor that is not used among the plurality of first and second differential transistors and a drain electrode of a transistor that is not used among the plurality of current source transistors to the first OFF voltage node, and
a second auxiliary interconnect for electrically connecting a drain electrode of a transistor that is not used among the plurality of first and second load transistors to the second OFF voltage node.

5. The operational amplifier of claim 2, wherein the first differential voltage interconnect overlaps gate electrodes of the plurality of first differential transistors,
the second differential voltage interconnect overlaps gate electrodes of the plurality of second differential transistors,
the first bias voltage interconnect overlaps gate electrodes of the plurality of current source transistors,
the second bias voltage interconnect overlaps gate electrodes of the plurality of first and second load transistors,
the first OFF voltage interconnect overlaps the gate electrodes of the plurality of first and second differential transistors and the gate electrodes of the plurality of current source transistors, and
the second OFF voltage interconnect overlaps the gate electrodes of the plurality of first and second load transistors.

6. The operational amplifier of claim 4, wherein the first output interconnect overlaps drain electrodes of the plurality of first differential transistors and drain electrodes of the plurality of first load transistors,
the second output interconnect overlaps drain electrodes of the plurality of second differential transistors and drain electrodes of the plurality of second load transistors,
the intermediate interconnect overlaps source electrodes of the plurality of first and second differential transistors and drain electrodes of the plurality of current source transistors,
the first auxiliary interconnect overlaps the drain electrodes and source electrodes of the first and second differential transistors and the drain electrodes of the plurality of current source transistors, and
the second auxiliary interconnect overlaps the drain electrodes of the plurality of first and second load transistors.

7. The operational amplifier of claim 1, wherein each of the plurality of first differential transistors is different from the other first differential transistors in at least one of gate width and gate length,
each of the plurality of second differential transistors is different from the other second differential transistors in at least one of gate width and gate length,
each of the plurality of current source transistors is different from the other current source transistors in at least one of gate width and gate length,
each of the plurality of first load transistors is different from the other first load transistors in at least one of gate width and gate length, and
each of Inc plurality of second load transistors is different from the other second load transistors in at least one of gate width and gate length.

8. The operational amplifier of claim 1, wherein the plurality of first differential transistors are placed side by side so that a source region and drain region of every adjacent transistors adjoin each other and the adjoining source region and drain region are made common,
the plurality of second differential transistors are placed side by side so that a source region and drain region of every adjacent transistors adjoin each other and the adjoining source region and drain region are made common,
the plurality of current source transistors are placed side by side so that a source region and drain region of every adjacent transistors adjoin each other and the adjoining source region and drain region are made common,
the plurality of first load transistors are placed side by side so that a source region and drain region of every adjacent transistors adjoin each other and the adjoining source region and drain region are made common, and
the plurality of second load transistors are placed side by side so that a source region and drain region of every adjacent transistors adjoin each other and the adjoining source region and drain region are made common.

9. A pipeline AD converter comprising a plurality of conversion stages each including the operational amplifier of any one of claims 1 to 8,
wherein each of the plurality of conversion stages includes:
an analog-digital conversion circuit for converting an input differential voltage from the preceding stage to a digital value;
a digital-analog conversion circuit for converting the digital value obtained by the analog-digital conversion circuit to an intermediate differential voltage; and
a charge operation circuit having a capacitance section for sampling the input differential voltage and the operational amplifier for amplifying a mixed differential voltage of the input differential voltage sampled by the capacitance section and the intermediate differential voltage obtained by the digital-analog conversion circuit, and
the operational amplifier included in each of the plurality of conversion stages is the same in the configuration of the element formation layer as the other operational amplifiers, and is different in the configuration of the interconnect layer from the other operational amplifiers.

10. An operational amplifier comprising:
a differential section for converting a differential voltage composed of first and second input voltages to a current pair;
a current adjustment section for adjusting the current amount supplied to the differential section; and
an active load section for receiving the current pair from the differential section,
wherein the differential section includes:
a plurality of first and second differential transistors having a first polarity;
a first switch portion for connecting gate electrodes of the plurality of first differential transistors to either one of a first input node for receiving the first input voltage and a first OFF voltage node for receiving a first OFF voltage for turning OFF a transistor having the first polarity; and
a second switch portion for connecting gate electrodes of the plurality of second differential transistors to either one of a second input node for receiving the second input voltage and the first OFF voltage node,
the current adjustment section includes:
a plurality of current source transistors having the first polarity; and
a third switch portion for connecting gate electrodes of the plurality of current source transistors to either one of a first bias node for receiving a first bias voltage for turning ON a transistor having the first polarity and the first OFF voltage node, and
the active load section comprises:
a plurality of first and second load transistors having a second polarity reverse to the first polarity; and
a fourth switch portion for connecting gate electrodes of the plurality of first and second load transistors to either one of a second bias node for receiving a second bias voltage for turning ON a transistor having the second polarity and a second OFF voltage node for receiving a second OFF voltage for turning OFF a transistor having the second polarity.

11. A pipeline AD converter comprising a plurality of conversion stages each including the operational amplifier of claim 10,
wherein each of the plurality of conversion stages includes:
an analog-digital conversion circuit for converting an input differential voltage from the preceding stage to a digital value;
a digital-analog conversion circuit for converting the digital value obtained by the analog-digital conversion circuit to an intermediate differential voltage; and
a charge operation circuit having a capacitance section for sampling the input differential voltage and the operational amplifier for amplifying a mixed differential voltage of the input differential voltage sampled by the capacitance section and the intermediate differential voltage obtained by the digital-analog conversion circuit, and
the operational amplifier included in each of the plurality of conversion stages is the same in configuration as the other operational amplifiers.

* * * * *